United States Patent
Otremba

(10) Patent No.: US 8,410,590 B2
(45) Date of Patent: Apr. 2, 2013

(54) DEVICE INCLUDING A POWER SEMICONDUCTOR CHIP ELECTRICALLY COUPLED TO A LEADFRAME VIA A METALLIC LAYER

(75) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 356 days.

(21) Appl. No.: 12/241,769

(22) Filed: Sep. 30, 2008

(65) Prior Publication Data
US 2010/0078784 A1  Apr. 1, 2010

(51) Int. Cl.
*H01L 23/495* (2006.01)
(52) U.S. Cl. .......... 257/676; 257/E21.506; 257/E23.031
(58) Field of Classification Search .................. 257/676, 257/E21.506, E23.031; 438/123
See application file for complete search history.

(56) References Cited

U.S. PATENT DOCUMENTS

| | | | | |
|---|---|---|---|---|
| 5,172,214 A * | 12/1992 | Casto | | 257/676 |
| 6,677,669 B2 * | 1/2004 | Standing | | 257/685 |
| 7,202,554 B1 * | 4/2007 | Kim et al. | | 257/686 |
| 7,271,470 B1 | 9/2007 | Otremba | | |
| 7,633,141 B2 | 12/2009 | Huber | | |
| 7,947,532 B2 | 5/2011 | Otremba et al. | | |
| 7,985,991 B2 | 7/2011 | Kajiwara et al. | | |
| 2003/0075786 A1 * | 4/2003 | Joshi et al. | | 257/676 |
| 2003/0214048 A1 * | 11/2003 | Wu et al. | | 257/777 |
| 2004/0212072 A1 * | 10/2004 | Wu | | 257/690 |
| 2005/0127483 A1 | 6/2005 | Joshi et al. | | |
| 2005/0224945 A1 * | 10/2005 | Saito et al. | | 257/686 |
| 2006/0138532 A1 * | 6/2006 | Okamoto et al. | | 257/328 |
| 2007/0132073 A1 * | 6/2007 | Tiong et al. | | 257/666 |
| 2007/0290337 A1 * | 12/2007 | Otremba et al. | | 257/737 |

FOREIGN PATENT DOCUMENTS

DE  10 2004 021 054 A1  11/2005

* cited by examiner

*Primary Examiner* — Kimberly Rizkallah
*Assistant Examiner* — Duy T Nguyen
(74) *Attorney, Agent, or Firm* — Dicke, Billig & Czaja, PLLC

(57) ABSTRACT

A device including a power semiconductor chip. One embodiment provides a power semiconductor chip having a first electrode on a first surface and a second and a third electrode on a second surface opposite to the first surface. A leadframe includes a carrier and a first lead, the power semiconductor chip placed over the carrier with the first surface of the power semiconductor chip facing the carrier. A metallic layer includes a first surface and a second surface opposite to the first surface. The metallic layer is placed over the second surface of the power semiconductor chip with the first surface of the metallic layer facing the power semiconductor chip. The second surface of the metallic layer and a surface of the first lead lie within a common mounting plane.

18 Claims, 22 Drawing Sheets

A-A'

US 8,410,590 B2

DEVICE INCLUDING A POWER SEMICONDUCTOR CHIP ELECTRICALLY COUPLED TO A LEADFRAME VIA A METALLIC LAYER

BACKGROUND

This invention relates to an electronic device including a power semiconductor chip, a system containing such a device and a method of manufacturing thereof.

Power semiconductor chips may, for example, be integrated into electronic devices. Power semiconductor chips are suitable, in particular, for the switching or control of currents and/or voltages. Power semiconductor chips may, for example, be implemented as power MOSFETs, IGBTs, JFETs, power bipolar transistors or power diodes.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
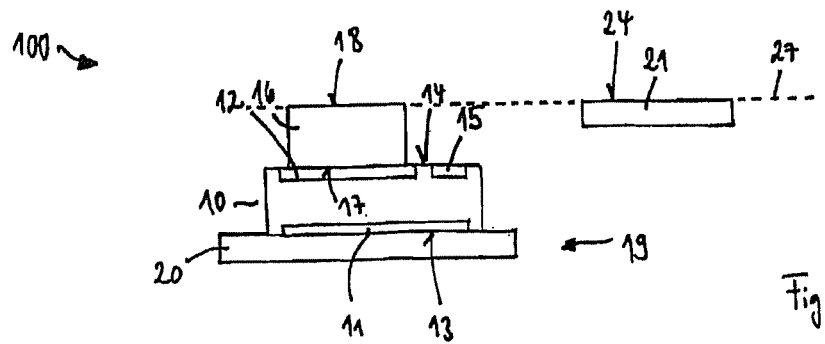
FIG. 1 schematically illustrates a cross-sectional view of one embodiment of a device including a power semiconductor chip, a leadframe and a metallic layer.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this Specification, the terms "coupled" and/or "electrically coupled" are not meant to mean that the elements must be directly coupled together; intervening elements may be provided between the "coupled" or "electrically coupled" elements.

Devices containing one or more semiconductor chips are described below. The semiconductor chips may be of different types, may be manufactured by different technologies and may include for example integrated electrical, electro-optical or electro-mechanical circuits and/or passives. The semiconductor chips may, for example, be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor chips may include control circuits, microprocessors or microelectromechanical components. Semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements on its two main surfaces, that is to say on its top side and bottom side. Power semiconductor chips may have a vertical structure. By way of example, the source electrode and gate electrode of a power MOSFET may be situated on one main surface, while the drain electrode of the power MOSFET is arranged on the other main surface. Furthermore, the devices described below may include integrated circuits to control the integrated circuits of other semiconductor chips, for example the integrated circuits of power semiconductor chips. The semiconductor chips need not be manufactured from specific semiconductor material, for example Si, SiC, SiGe, GaAs, and, furthermore, may contain inorganic and/or organic materials that are not semiconductors, such as for example insulators, plastics or metals. Moreover, the semiconductor chips may be packaged or unpackaged.

The semiconductor chips have electrodes (or contact pads) which allow electrical contact to be made with the integrated circuits included in the semiconductor chips. One or more metal layers may be applied to the electrodes of the semiconductor chips. The metal layers may be manufactured with any desired geometric shape and any desired material composition. The metal layers may, for example, be in the form of a layer covering an area. Any desired metal or metal alloy, for example aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible. The electrodes may be situated on the active main surfaces of the semiconductor chips or on other surfaces of the semiconductor chips.

The semiconductor chips may be placed on leadframes. The leadframes may be of any shape, size and material. The leadframes may include carriers and leads. During the fabrication of the devices the carriers and leads may be connected to each other. The carriers and leads may also be made from one piece. The carriers and leads may be connected among each other by connection means with the purpose of separating some of the carriers and leads in the course of the fabrication. Separation of the carriers and leads may be carried out by mechanical sawing, a laser beam, cutting, stamping, milling, etching or any other appropriate method. The leadframes may be electrically conductive. They may be fabricated from metals or metal alloys, copper, copper alloys, iron nickel, aluminum, aluminum alloys, steel, stainless steel or other appropriate materials. The leadframes may be plated with an electrically conductive material, for example copper, silver, iron nickel or nickel phosphorus. The leads of the leadframe may be bent during fabrication, for example in an S-shaped manner.

One or more metallic layers may be placed over the semiconductor chip. The metallic layers may, for example, be used to produce a redistribution layer. The metallic layers may be used as wiring layers to make electrical contact with the semiconductor chip from outside the device and/or to make electrical contact with other semiconductor chips and/or components contained in the device. The metallic layers may be manufactured with any desired geometric shape and any desired material composition. The metallic layers may, for example, be composed of conductor tracks, but may also be in the form of a layer covering an area. Any desired metal, for example, aluminum, nickel, palladium, silver, tin, gold or copper, or metal alloy may be used as the material. The metallic layers need not be homogenous or manufactured from just one material, that is to say various compositions and concentrations of the materials contained in the metallic layers are possible. Furthermore, the metallic layers may be arranged above or below or between electrically insulating layers.

The metallic layers may be embodied as a metallic clip which may be used to electrically couple components to each other within the device. For example, an electrode of a semiconductor chip may be electrically coupled to an external contact element, for example the lead of a leadframe, by a metallic clip. The metallic clip may be soldered to the components. The metallic clip may include of a first portion and a second portion, wherein the second portion is oriented orthogonal to the first portion. The first portion may be integral with the second portion. Furthermore, the metallic clip may contain a third portion which is also oriented orthogonal to the first portion. The metallic clip may be fabricated from metals or metal alloys, for example, copper, copper alloys, iron nickel, aluminum, aluminum alloys, steel, stainless steel or other appropriate materials.

The devices described below include external contact elements or external contact pads, which may be of any shape and size. The external contact elements may be accessible from outside the device and may thus allow electrical contact to be made with the semiconductor chips from outside the device. For this reason, the external contact elements may have external contact surfaces which can be accessed from outside the device. Furthermore, the external contact elements may be thermally conductive and may serve as heat sinks for dissipating the heat generated by the semiconductor chips. The external contact elements may be composed of any desired electrically conducting material, for example of a metal, such as copper, aluminum or gold, a metal alloy or an electrically conducting organic material. Some of the external contact elements may be leads of a leadframe.

The devices may include a mold material covering at least parts of the components of the devices. The mold material may be any appropriate thermoplastic or thermosetting material. Various techniques may be employed to cover the components with the mold material, for example compression molding, injection molding, powder molding or liquid molding.

The devices may have mounting surfaces. The mounting surface may serve to mount the device onto another component, for example a circuit board, such as a PCB (Printed Circuit Board). External contact elements, including external contact surfaces may be disposed on the mounting surface to allow to electrically couple the device to the component on which the device is mounted. Solder deposits, such as solder balls, or other appropriate connection elements may be used to establish an electrical and mechanical connection between the device and the component on which the device is mounted.

FIG. 1 schematically illustrates a device 100 in a cross-sectional view. The device 100 includes a power semiconductor chip 10. The power semiconductor chip 10 has a first electrode 11 and a second electrode 12. The first electrode 11 is arranged on a first surface 13 of the power semiconductor chip 10, and the second electrode 12 is arranged on a second surface 14 of the power semiconductor chip 10. The second surface 14 is opposite to the first surface 13. Moreover, the power semiconductor chip 10 includes a third electrode 15 which is arranged on the second surface 14.

The device 100 further includes a leadframe 19 consisting of at least a carrier 20 and a lead 21. The power semiconductor chip 10 is placed over the carrier 20 with the first surface 13 facing the carrier 20.

A metallic layer 16 is placed over the second surface 14 of the power semiconductor chip 10. The metallic layer 16 has a first surface 17 and a second surface 18 opposite to the first surface 17. The metallic layer 16 is placed over the power semiconductor chip 10 such that the first surface 17 of the metallic layer 16 faces the second surface 14 of the power semiconductor chip 10. The second surface 18 of the metallic layer 16 and a surface 24 of the lead 21 lie within a common mounting plane 27.

Figure 2A:
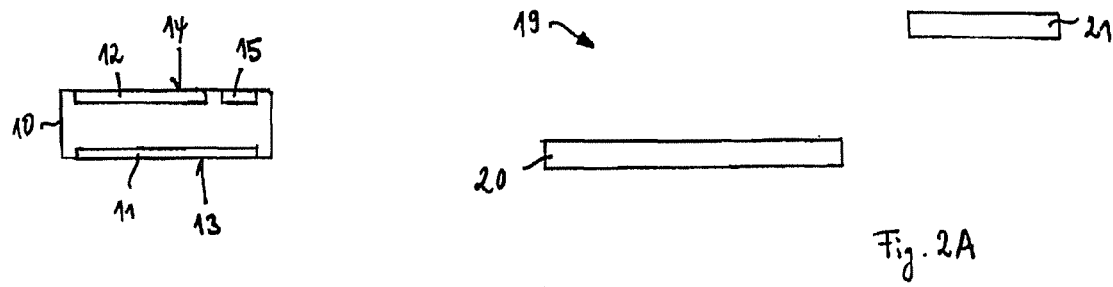
FIGS. 2A to 2C schematically illustrate a cross-sectional view of one embodiment of a method of manufacturing a device including a power semiconductor chip, a leadframe and a metallic layer.
Figure 2B:
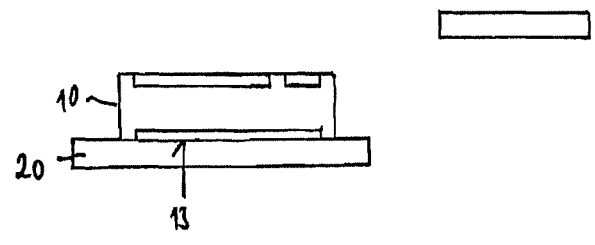
Figure 2C:
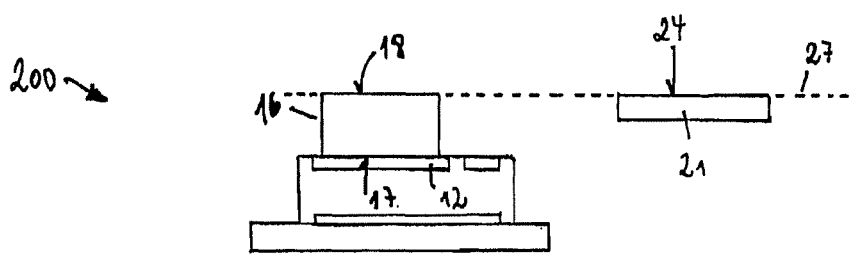

FIGS. 2A to 2C schematically illustrate one embodiment of a method for production of a device 200, which is illustrated in FIG. 2C in a cross-sectional view.

As illustrated in FIG. 2A a power semiconductor chip 10 and a leadframe 19 are provided. The power semiconductor chip 10 includes a first, a second and a third electrode 11, 12 and 15. The first electrode 11 is arranged on a first surface 13 of the power semiconductor chip 10, and the second and third electrodes 12, 15 are arranged on a second surface 14 of the power semiconductor chip 10. The second surface 14 is opposite to the first surface 13. The leadframe 19 consists of at least a carrier 20 and a lead 21.

The power semiconductor chip 10 is mounted on the carrier 20 with the first surface 13 facing the carrier 20 as illustrated in FIG. 2B. As illustrated in FIG. 2C, a metallic layer 16 is placed over the second electrode 12 of the power semiconductor chip 10. The metallic layer 16 has a first surface 17 and a second surface 18 opposite to the first surface 17. The metallic layer 16 is placed over the power semiconductor chip 10 such that the first surface 17 of the metallic layer 16 faces the second surface 14 of the power semiconductor chip 10. The second surface 18 of the metallic layer 16 and a surface 24 of the lead 21 lies within a common mounting plane 27.

Figure 3A:
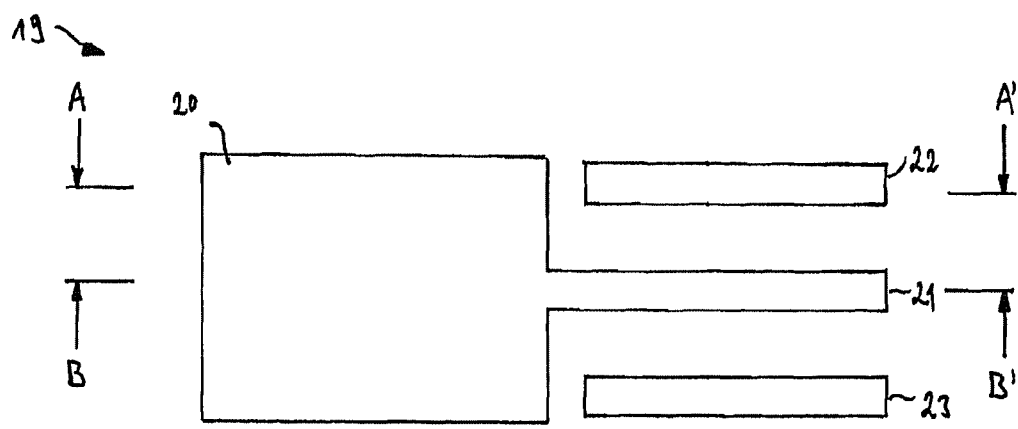
FIGS. 3A to 3F schematically illustrate a top plan view and a cross-sectional view of one embodiment of a method of manufacturing a device including a power semiconductor chip and a metallic clip.
Figure 3A:
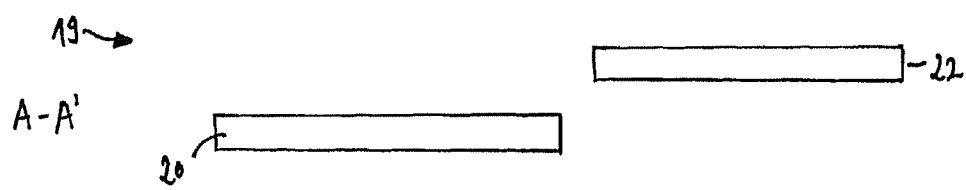
Figure 3A:
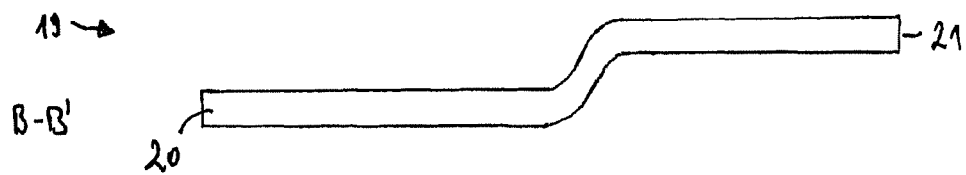
Figure 3B:
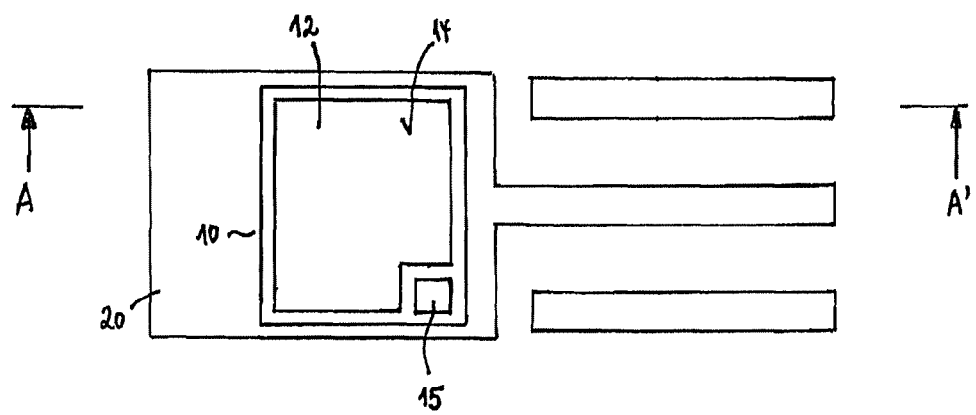
Figure 3B:
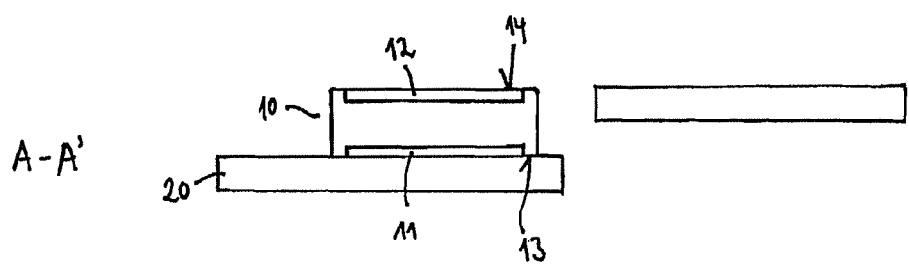
Figure 3C:
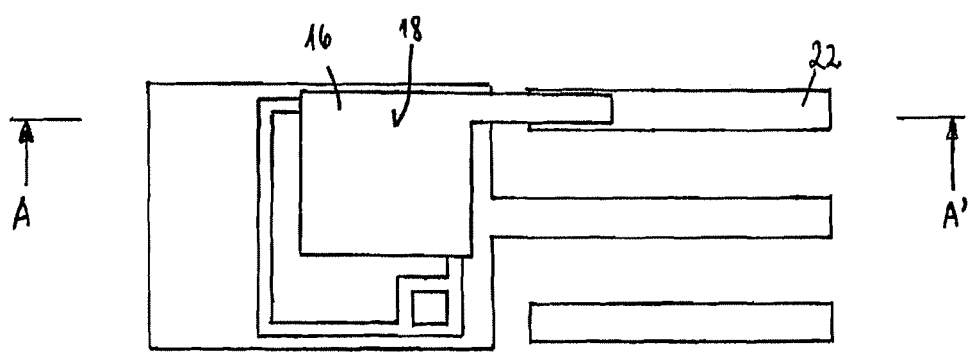
Figure 3C:
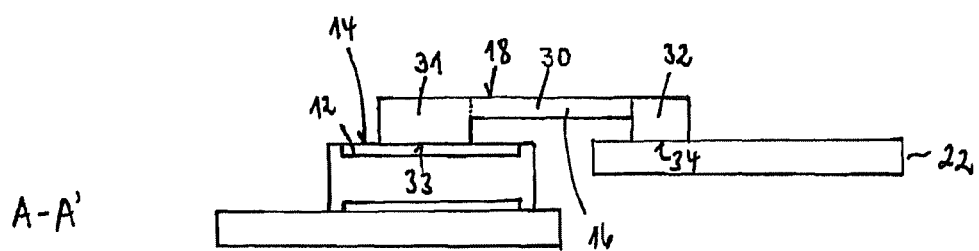
Figure 3D:
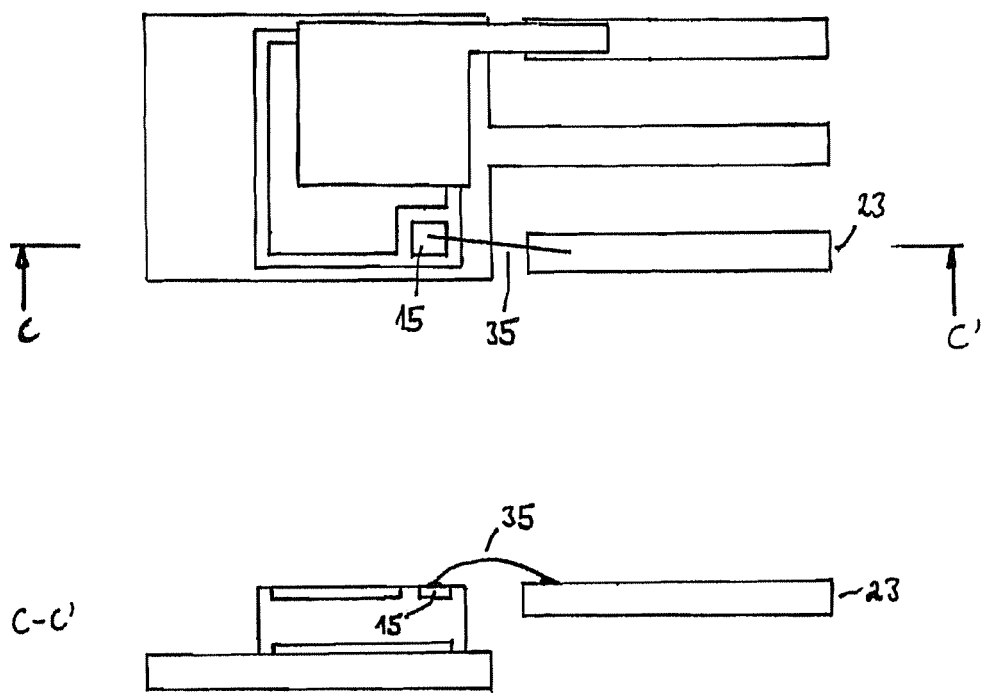
Figure 3E:
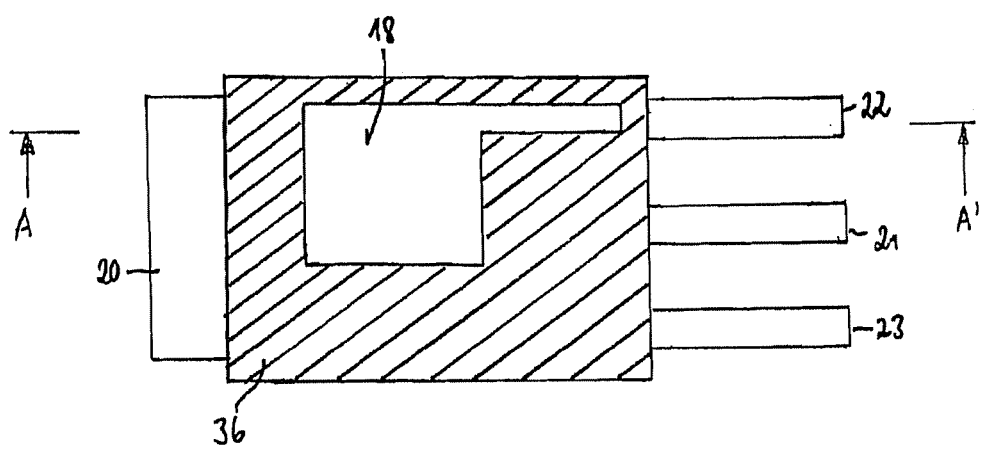
Figure 3E:
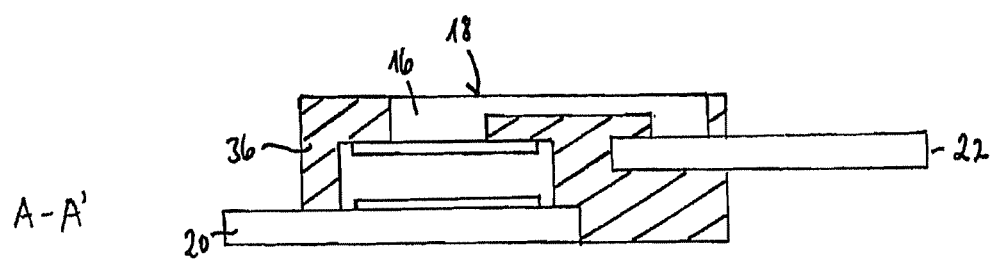
Figure 3F:
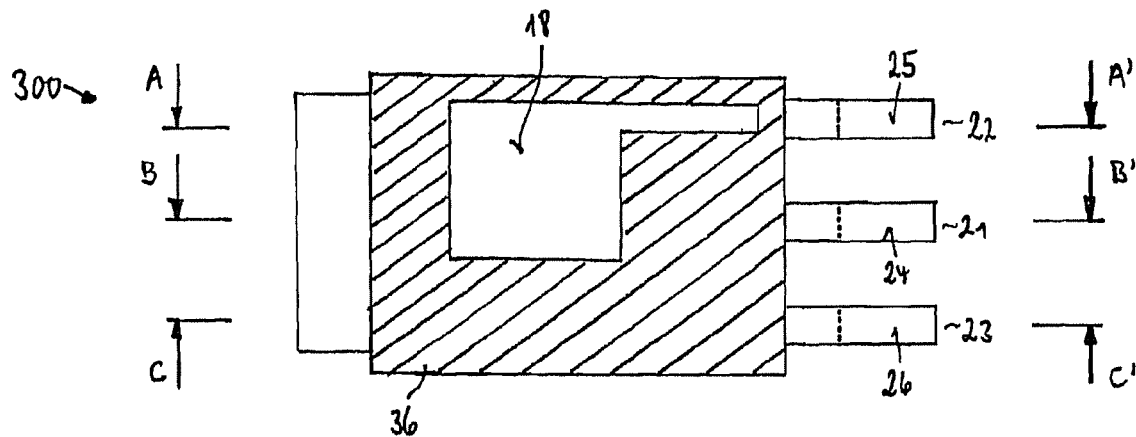
Figure 3F:
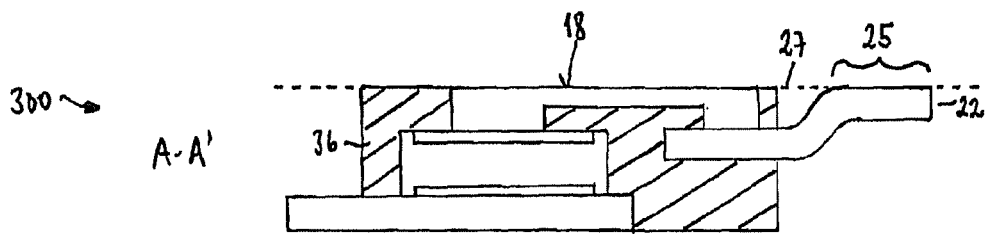
Figure 3F:
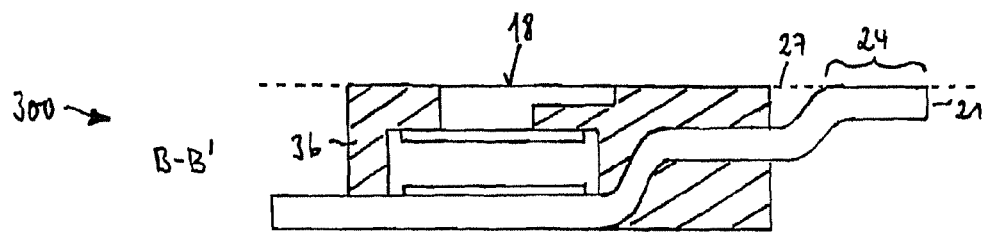
Figure 3F:
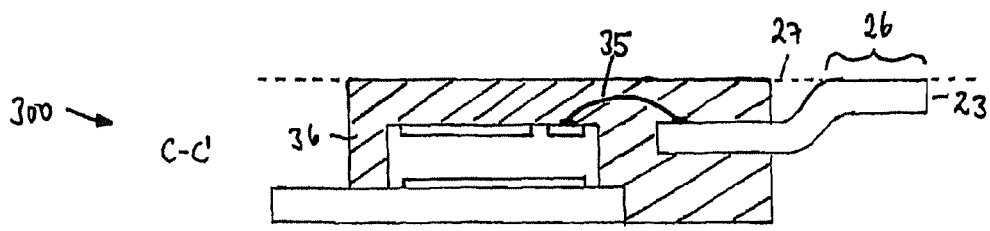

FIGS. 3A to 3F schematically illustrate one embodiment of a method for production of a device 300, which is illustrated in FIG. 3F. The device 300 is an implementation of the devices 100 and 200 illustrated in FIGS. 1 and 2C. The details of the device 300 that are described below can therefore be likewise applied to the devices 100 and 200. Furthermore, the details of the production method that are described below can be likewise applied to the production method illustrated in FIGS. 2A to 2C. Similar or identical components of the devices 100, 200 and 300 are denoted by the same reference numerals.

In FIG. 3A a leadframe 19 is provided. The leadframe 19 is illustrated in a top plan view (top), a cross-sectional view (middle) along the line A-A' depicted in the top plan view and a cross-sectional view (bottom) along the line B-B' depicted in the top plan view. The leadframe 19 may include a plurality of carriers (or die pads) 20, only one of them is illustrated in FIG. 3A. Three leads 21, 22 and 23 (or more leads) may be assigned to each of the carriers 20. The leads 21, 22 and 23 may protrude substantially in parallel from one side of the carrier 20. The lead 21 may be contiguous with one side of the carrier 20. The carriers 20 and the leads 21, 22 and 23 may be linked by dams (tie bars), which are not illustrated in FIG. 3A for reasons of clarity. As illustrated in the cross-sectional views of FIG. 3A, the leads 21, 22 and 23 may be arranged in a different plane than the carrier 20, but may in one embodiment be arranged in the same plane.

The leadframe 19 may be manufactured from metals or metal alloys, for example, copper, copper alloys, iron nickel, aluminum, aluminum alloys, or other electrically conductive materials. Furthermore, the leadframe 19 may be plated with an electrically conductive material, for example copper, silver, iron nickel or nickel phosphorus. The shape of the leadframe 19 is not limited to any size or geometric shape. For example, the leadframe 19 may have a thickness in the range from 100 μm to 1 mm or may be even thicker. The leadframe 19 may have been manufactured by punching, milling or stamping a metallic plate.

A power semiconductor chip 10 may be placed over the carrier 20 as illustrated in FIG. 3B. Further semiconductor chips 10, which may also be power semiconductor chips, may be placed over further carriers 20 of the leadframe 19, which are not illustrated in FIG. 3B. The semiconductor chips 10 may have been fabricated on a wafer made of semiconductor material. The semiconductor chips 10 may have been manufactured on the same wafer, but may have been manufactured on different wafers. Furthermore, the semiconductor chips 10 may be physically identical, but may also contain different integrated circuits.

The power semiconductor chip 10 may be mounted onto the carrier 20 with its first surface 13 facing the carrier 20. The power semiconductor chip 10 may have a first electrode 11 on the first surface 13 and a second electrode 12 on a second surface 14. The first and second electrodes 11, 12 may be load electrodes. Furthermore, the power semiconductor chip 10 may have a third electrode 15 on its second surface 14. The third electrode 15 may be a control electrode. The top surface of the carrier 20 may be larger than the first surface 13 of the power semiconductor chip 10.

The power semiconductor chip 10 may be configured as a power transistor, for example a power MOSFET, IGBT, JFET or power bipolar transistor. In the case of a power MOSFET or a JFET, the first load electrode 11 is a drain electrode, the second load electrode 12 is a source electrode, and the control electrode 15 is a gate electrode. In the case of an IGBT, the first load electrode 11 is a collector electrode, the second load electrode 12 is an emitter electrode, and the control electrode 15 is a gate electrode. In the case of a power bipolar transistor, the first load electrode 11 is a collector electrode, the second load electrode 12 is an emitter electrode, and the control electrode 15 is a base electrode. During operation, voltages of up to 5, 50, 100, 500 or 1000 V or even higher may be applied between the load electrodes 11 and 12. The switching frequency applied to the control electrode 15 may be in the range from 1 kHz to 100 MHz, but may also be outside this range.

The first electrode 11 may be electrically coupled to the carrier 20 by diffusion soldering. For that, a solder material may be deposited on the first electrode 11 or the upper surface of the carrier 20 (not illustrated), for example by sputtering or other appropriate physical or chemical deposition methods. The solder material may have a thickness in the range from 100 nm to 10 μm, in one embodiment in the range from 1 to 3 μm. During the soldering operation, the solder material diffuses into the adjacent materials which leads to an intermetallic phase at the interface between the power semiconductor chip 10 and the carrier 20. The solder material may, for example, consist of AuSn, AgSn, CuSn, Sn, AuIn, AgIn, AuSi or CuIn.

For producing the soldered joint, the leadframe 19 may be heated by a hot plate to a temperature above the melting point of the solder material, for example, in the range from 200 to 400° C., in the range from 330 to 350° C. In one embodiment, both the leadframe 19 and the power semiconductor chip 10 may be placed in an oven and heated to an appropriate temperature. A pick-and-place tool may be used capable of picking the power semiconductor chip 10 and placing it on the heated carrier 20. During the soldering process the power semiconductor chip 10 may be pressed onto the carrier 20 for an appropriate time in the range from 10 to 200 ms, in one embodiment around 50 ms.

Instead of a diffusion soldering process, other connection techniques may be used to attach the power semiconductor chip 10 to the carrier 20, for example soft soldering or adhesive bonding by using an electrically conductive adhesive. When using a soft soldering process to join the power semiconductor chip 10 and the carrier 20 to each other, solder material remains at the interface between the power semiconductor chip 10 and the carrier 20 after the soldering process has been finished. In case of adhesive bonding, an electrically conductive adhesive may be used, which may be based on filled or unfilled polyimides, epoxy resins, acrylate resins, silicone resins or mixtures thereof and may be enriched with gold, silver, nickel or copper in order to produce electrical conductivity.

As illustrated in FIG. 3C a metallic layer 16 may be placed over the power semiconductor chip 10 and the lead 22. In one embodiment the metallic layer 16 may be embodied as a metallic clip 16. The metallic clip 16 may consist of three portions 30, 31 and 32 which are indicated in FIG. 3C by dashed lines. The portion 30 may extend parallel to the upper surfaces of the power semiconductor chip 10 and the leadframe 19. The portions 31 and 32 may extend substantially orthogonal to the portion 30. One end of the portion 31 may have a contact surface 33, which is attached to the second electrode 12 of the power semiconductor chip 10. The surface area of the contact surface 33 may be smaller than the surface area of the second electrode 12. One end of the portion 32 may have a contact surface 34, which is attached to the upper surface of the lead 22.

The metallic clip 16 may be manufactured from a metal or a metal alloy, for example, copper, copper alloys, iron nickel, aluminum, aluminum alloys, or other electrically conductive materials. Furthermore, the metallic clip 16 may be plated with an electrically conductive material, for example copper, silver, iron nickel or nickel phosphorus. The shape of the metallic clip 16 is not limited to any size or geometric shape. The metallic clip 16 may have the shape as exemplarily illustrated in FIG. 3C, but any other shape is also possible. The metallic clip 16 may have a thickness in the range from 100 μm to some millimeters or may be even thicker. The metallic clip 16 may be fabricated by stamping, punching, pressing, cutting, sawing, milling or any other appropriate technique.

Instead of using a single metallic clip 16, an integral array of metallic clips may be provided and may be placed over the semiconductor chips mounted on the leadframe 19. Later on in the manufacturing process, the individual devices may be separated by dividing the integral array of metallic clips.

The metallic clip 16 may be attached to the power semiconductor chip 10 and the lead 22 in a similar manner as the power semiconductor chip 10 has been attached to the carrier 20. For example, a diffusion soldering process may be carried out. For that, a solder material may be deposited on the contact surfaces 33 and 34 of the metallic clip 16 or the upper surfaces of the electrode 12 and the lead 22, for example, by sputtering or other appropriate physical or chemical deposition methods. The layers of the solder material may have a thickness in the range between 10 and 30 μm. The solder material may, for example, consist of AuSn, AgSn, CuSn, Sn, AuIn, AgIn, AuSi or CuIn. For producing the soldered joint, the solder material may be heated to a temperature above the melting point of the solder material, for example in the range from 200 to 400° C. A pick-and-place tool may be used capable of picking the metallic clip 16 and placing it on the power semiconductor chip 10 and the lead 22.

Instead of diffusion soldering a soft soldering process may be performed in order to fasten the metallic clip 16 to the power semiconductor chip 10 and the lead 22. As a further alternative, adhesive bonding by using an electrically conductive adhesive may be employed.

Before or after the attachment of the metallic clip 16 to the power semiconductor chip 10 and the lead 22, an electrical interconnection may be established between the control electrode 15 of the power semiconductor chip 10 and the lead 23. This interconnection may be made by wire bonding as illustrated in FIG. 3D. For example, ball bonding or wedge bonding may be used as the interconnect technique to produce a bond wire 35. The bond wire 35 may be made up of gold, aluminum, copper or any other appropriate electrically conductive material. One or more bond wires 35 may be attached to electrically couple the control electrode 15 to the lead 23.

Instead of wire bonding, other interconnect techniques may be used. For example, a metallic clip may be placed on the control electrode 15 and the lead 23 in order to establish the electrical connection.

A mold transfer process may be carried out to encapsulate the components arranged on the leadframe 19 with a mold material 36 as illustrated in FIG. 3E. The mold material 36 may encapsulate any portion of the device 300, but leaves at least the upper surface 18 of the metallic clip 16 and parts of the leads 21, 22 and 23 uncovered. Furthermore, parts of the carrier 20 may not be covered with the mold material 36, in one embodiment the bottom surface of the carrier 20. The top surface of the mold material 36 may form a plane together with the top surface 18 of the metallic clip 16 as illustrated in FIG. 3E.

The mold material 36 may be composed of any appropriate thermoplastic or thermosetting material, in one embodiment it may be composed of a material commonly used in contemporary semiconductor packaging technology. Various techniques may be employed to cover the components of the device 300 with the mold material 36, for example compression molding, injection molding, powder molding or liquid molding.

Before or after the encapsulation with the mold material 36, the individual devices 300 are separated from one another by separation of the leadframe 19, for example by sawing or cutting the dams of the leadframe 19. Other separation methods, such as etching, milling, laser ablation or stamping, may also be employed.

As illustrated in FIG. 3F, the leads 21, 22 and 23 may be bent, for example in an S-shape manner to form a step as depicted in FIG. 3F. Bending the leads 21, 22 and 23 may, for example, be carried out in the course of a trim and form process. In the present embodiment, the ends of the leads 21, 22 and 23 are bent in the direction of the metallic clip 16. The leads 21, 22 and 23 may be bent such that their top surfaces 24, 25 and 26, respectively, (illustrated in FIG. 3F by dashed lines) are arranged in the plane 27, which is defined by the exposed surface 18 of the metallic clip 16 and in one embodiment the top surface of the mold material 36. It may be provided that the surface area of the exposed surface 18 of the metallic clip 16, which is electrically coupled to the electrode 12 of the power semiconductor chip 10, is larger than the contact area of the surface 24 of the lead 21, which is electrically coupled to the electrode 11 of the power semiconductor chip 10.

The metallic clip 16 and the leads 21, 22 and 23 may serve as external contact elements of the device 300. The surface 18 of the metallic clip 16 and the surfaces 24, 25 and 26 of the leads 21, 22 and 23 may be used as external contact surfaces to electrically couple the device 300 to other components, for example a circuit board, such as a PCB (Printed Circuit Board). The surface 27 of the device 300 may be used as a mounting surface to mount the device 300 on a circuit board.

It is obvious to a person skilled in the art that the device 300 is only intended to be an exemplary embodiment, and many variations are possible. Although the device 300 in the embodiment illustrated in FIG. 3F includes exactly one semiconductor chip, which is the power semiconductor chip 10, the device 300 may include two or more semiconductor chips and/or passives. The semiconductor chips and passives may differ in function, size, manufacturing technology etc. For example, a semiconductor chip controlling the power semiconductor chip 10 may be included in the device 300.

The lead 22 of the device 300 may be used to allow to measure the electrical potential of the electrode 12 of the power semiconductor chip 10 by an external device. However, the lead 22 may also be omitted. Such a device 400 is schematically illustrated in FIG. 4F. FIGS. 4A to 4F schematically illustrate a method for production of the device 400. Most of the fabrication processes of the device 400 are similar or identical to the fabrication processes of the device 300.

Figure 4A:
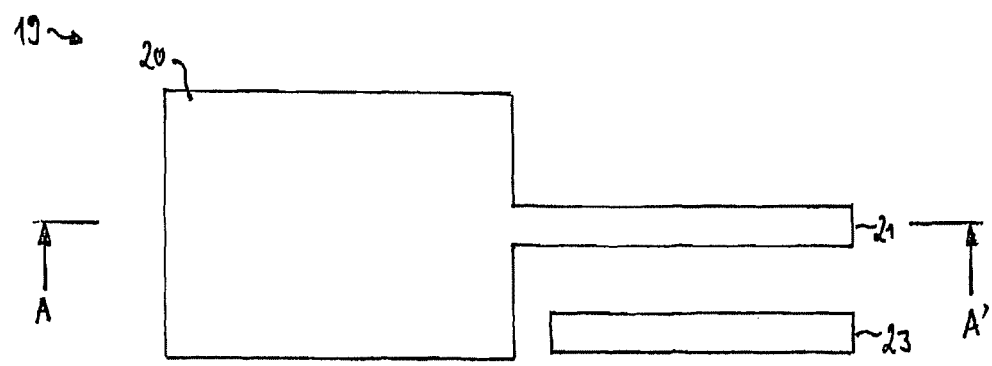
FIGS. 4A to 4F schematically illustrate a top plan view and a cross-sectional view of one embodiment of a method of manufacturing a device including a power semiconductor chip and a metallic plate.
Figure 4A:
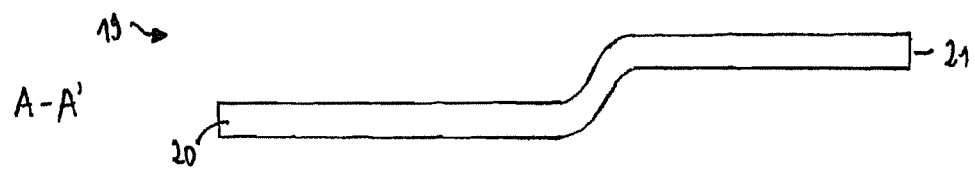
Figure 4B:
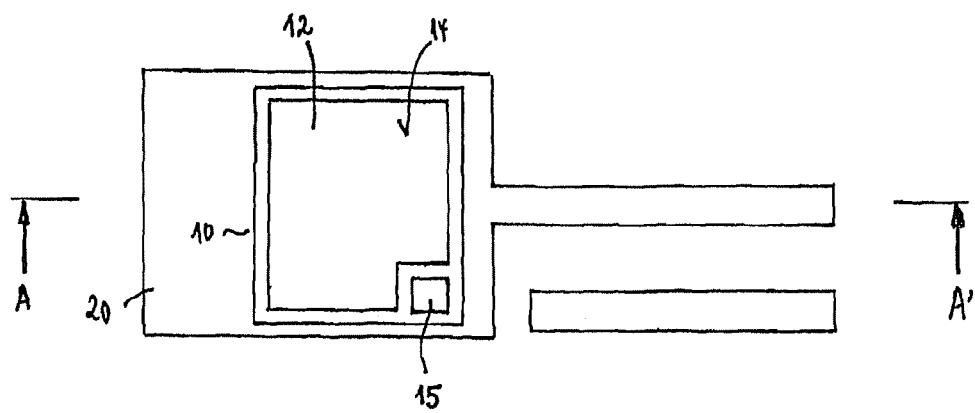
Figure 4B:
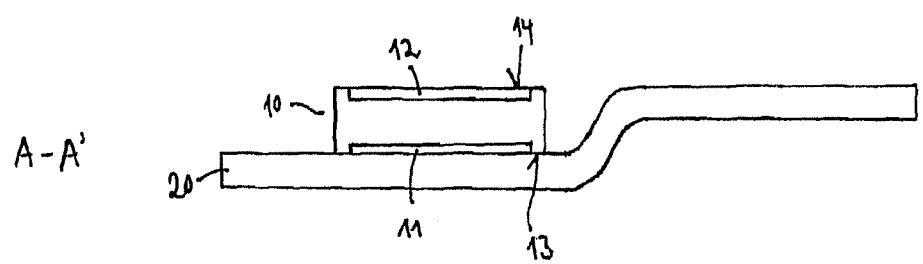

As illustrated in FIG. 4A, a leadframe 19 is provided, which is substantially the same leadframe 19 as illustrated in FIG. 3A, but does not include the lead 22. The power semiconductor chip 10 may be placed on the leadframe 19 as illustrated in FIG. 4B.

Figure 4C:
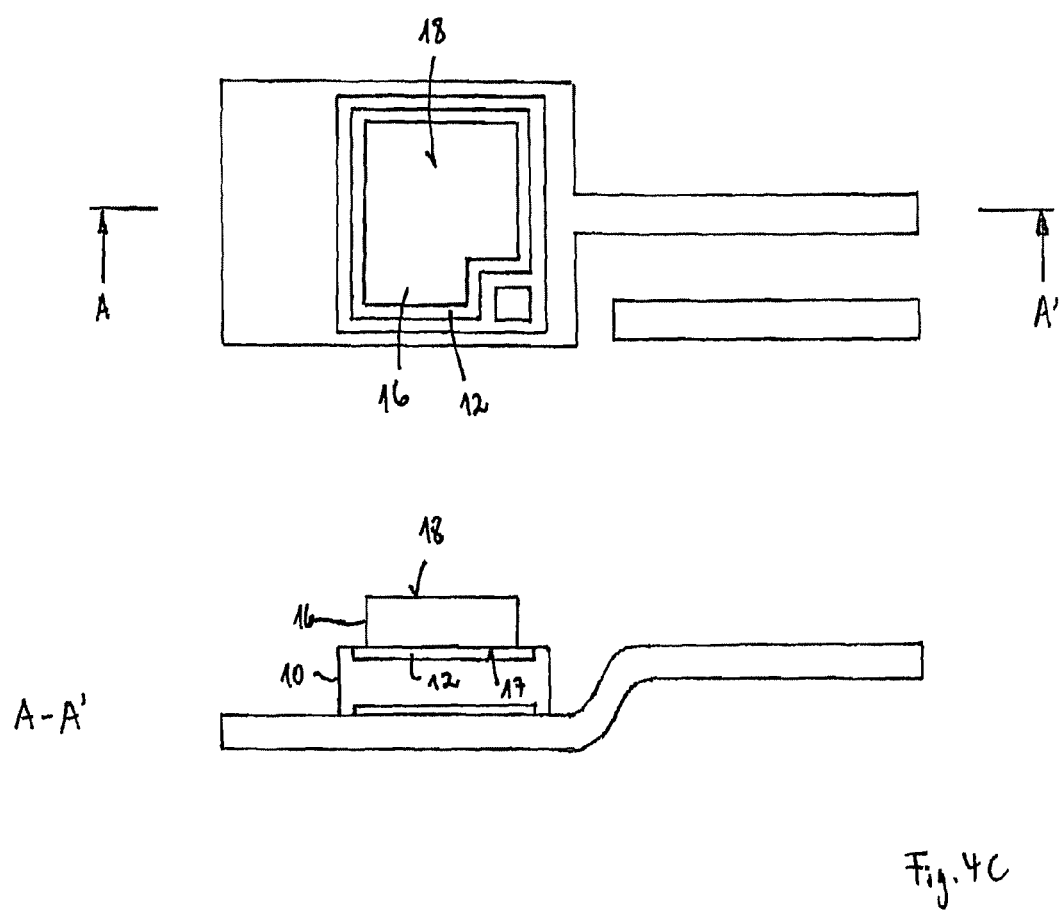

In FIG. 4C a metallic plate 16 is mounted on the electrode 12 of the power semiconductor chip 10. The metallic plate 16 corresponds to the metallic layer 16 of the device 100 illustrated in FIG. 1. The metallic plate 16 may be manufactured using the same or similar metals or metal alloys and manufacturing methods as for the metallic clip 16 of the device 300. A contact surface 17 of the metallic plate 16 may be attached to the electrode 12. The surface area of the contact surface 17 may be smaller or may in one embodiment be larger than the surface area of the second electrode 12.

Figure 4D:
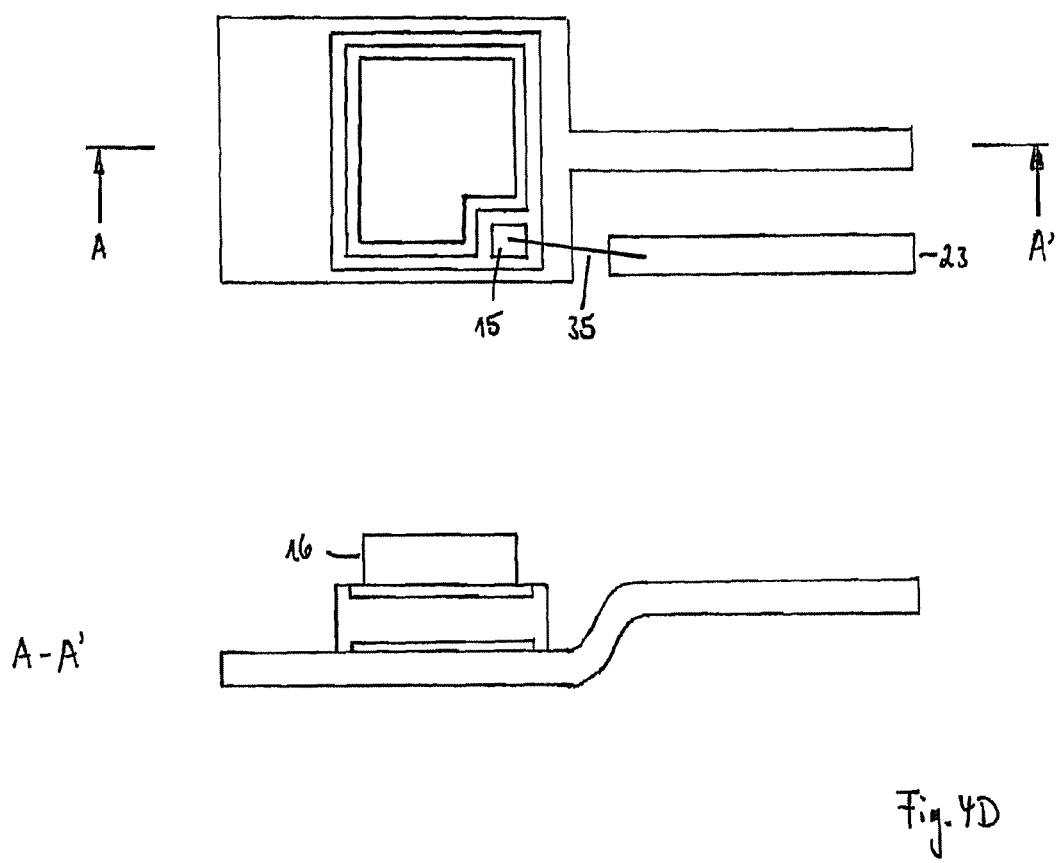
Figure 4E:
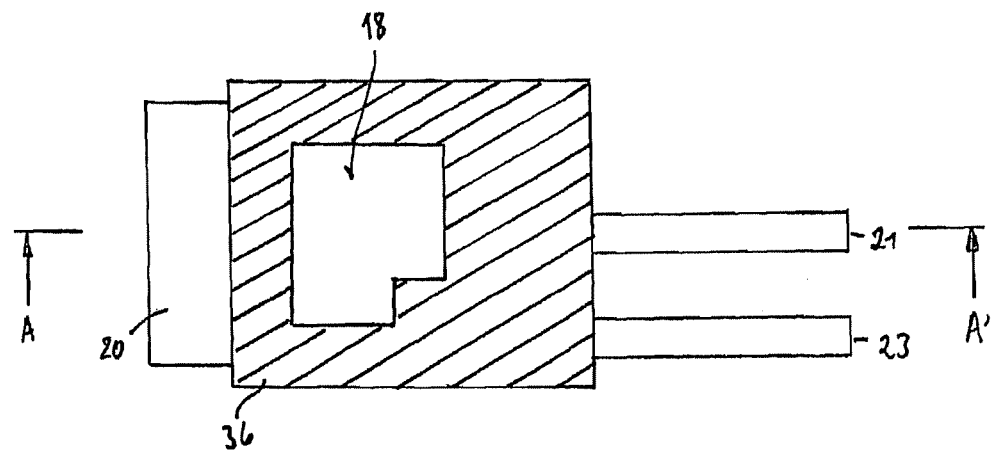
Figure 4E:
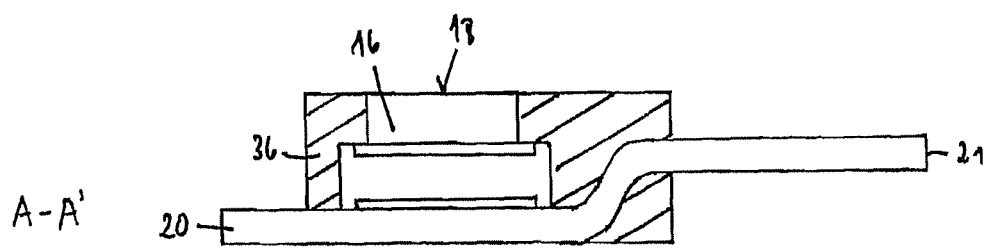
Figure 4F:
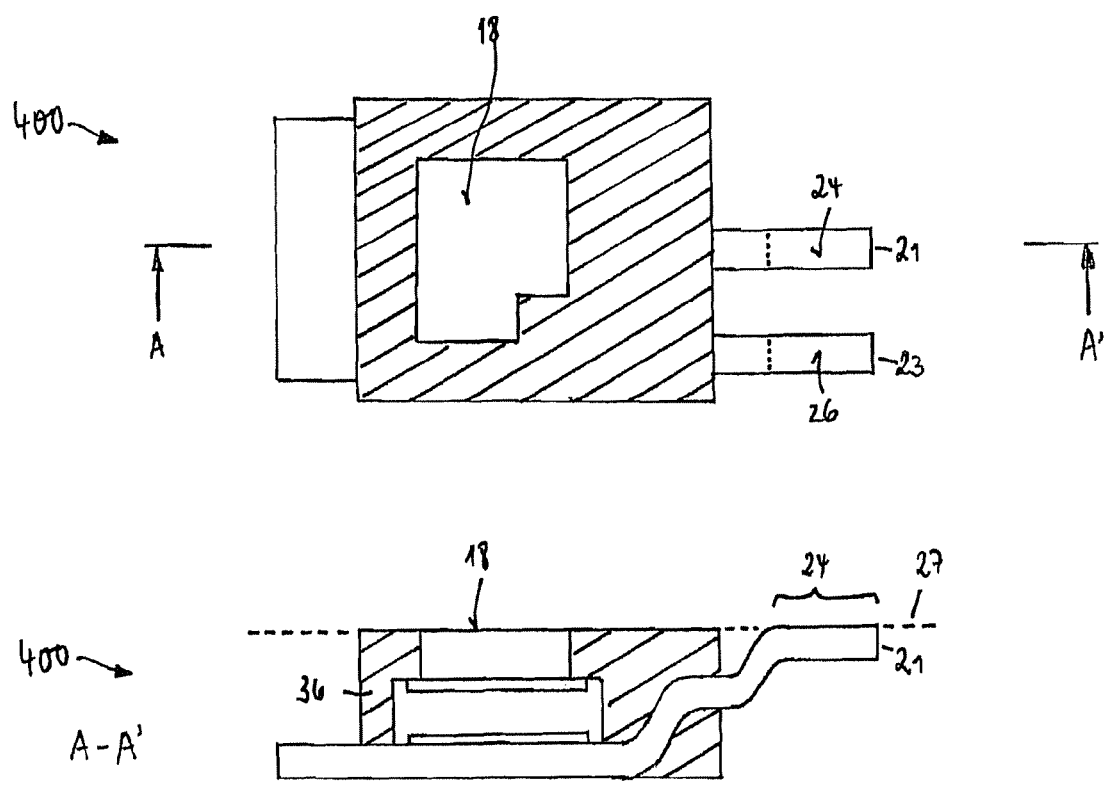

The fabrication processes illustrated in FIGS. 4D to 4F are substantially the same as the fabrication processes illustrated in FIGS. 3D to 3F. The device 400 obtained by the fabrication method illustrated in FIGS. 4A to 4F is similar to the device 300, but does not include the lead 22. The electrode 12 of the power semiconductor chip 10 can be accessed via the surface 18 of the metallic plate 16, which is exposed from the mold material 36 and is disposed in the mounting surface 27. The top surfaces 24 and 26 of the leads 21 and 23, respectively, are also disposed in the mounting surface 27 and function as external contact surfaces together with the surface 18 of the metallic plate 16.

Instead of using a metallic plate 16, metallic material may be deposited onto the electrode 12 of the power semiconductor chip 10 by using electrochemical deposition methods, such as galvanic depositing, or other appropriate deposition methods, for example physical or chemical vapor depositing.

Furthermore, the metallic layer 16 may be produced after the encapsulation of the components with the mold material 36. Such a device 500 is schematically illustrated in FIG. 5G. FIGS. 5A to 5G schematically illustrate a method for production of the device 500. Some of the fabrication processes of the device 500 are similar or identical to the fabrication processes of the device 400.

Figure 5A:
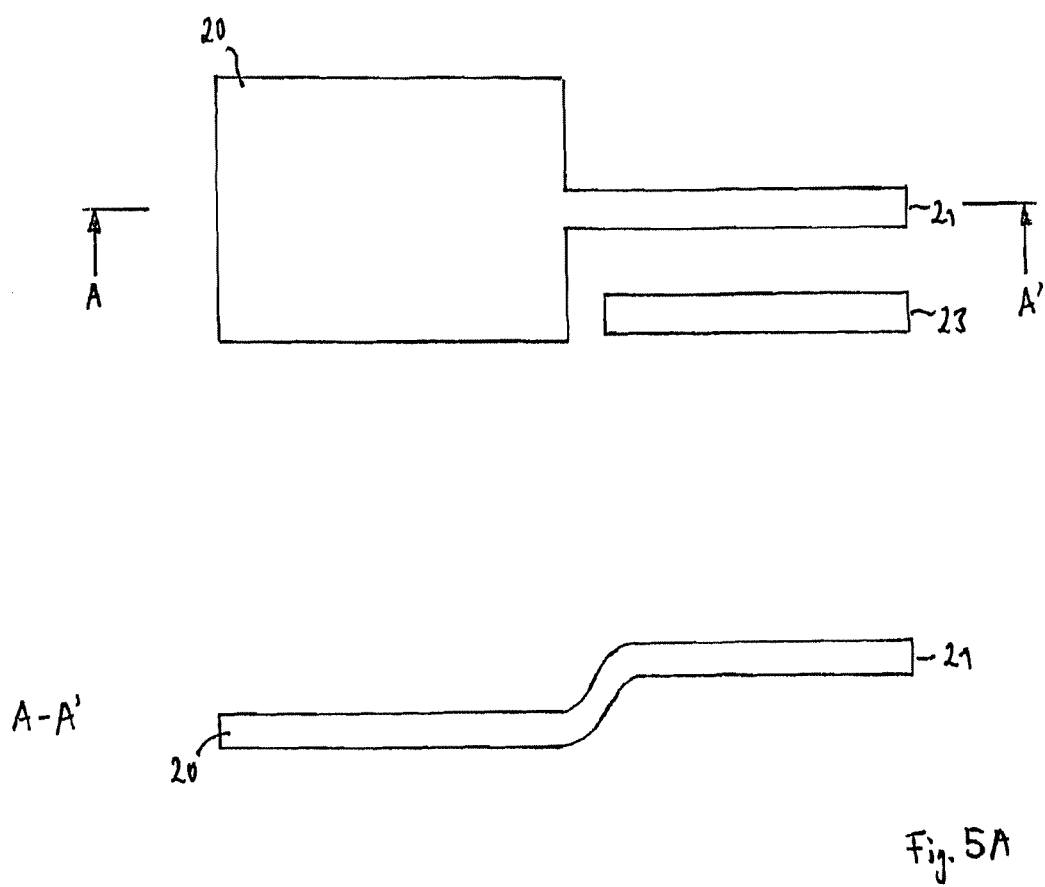
FIGS. 5A to 5G schematically illustrate a top plan view and a cross-sectional view of one embodiment of a method of manufacturing a device including a power semiconductor chip and an electrochemically deposited metallic layer.
Figure 5B:
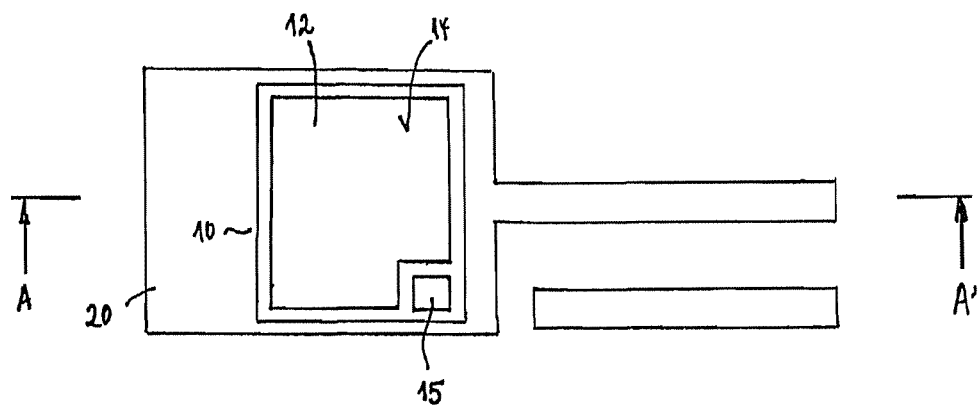
Figure 5B:
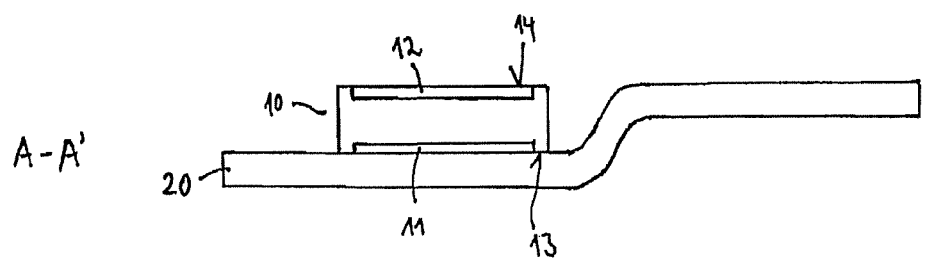
Figure 5C:
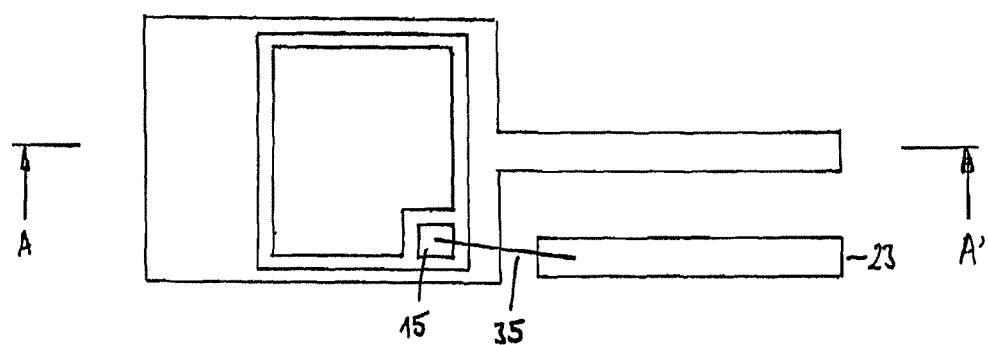
Figure 5C:
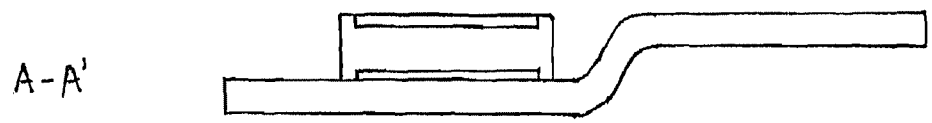
Figure 5D:
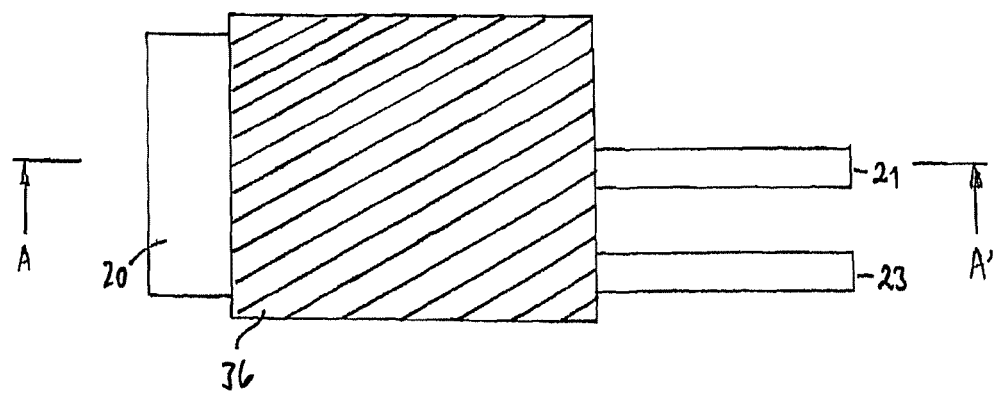
Figure 5D:
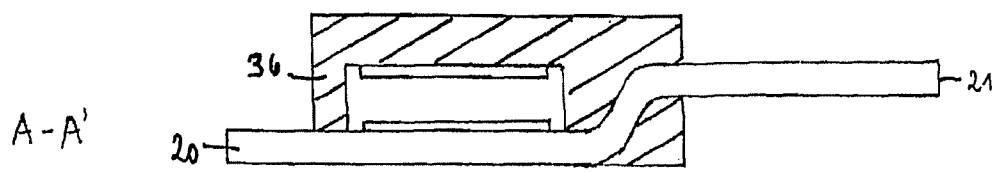

The fabrication processes illustrated in FIGS. 5A to 5C are substantially the same as the fabrication processes illustrated in FIGS. 4A, 4B and 4D. As illustrated in FIG. 5D, the components mounted on the leadframe 19 are then encapsulated by the mold material 36.

Figure 5E:
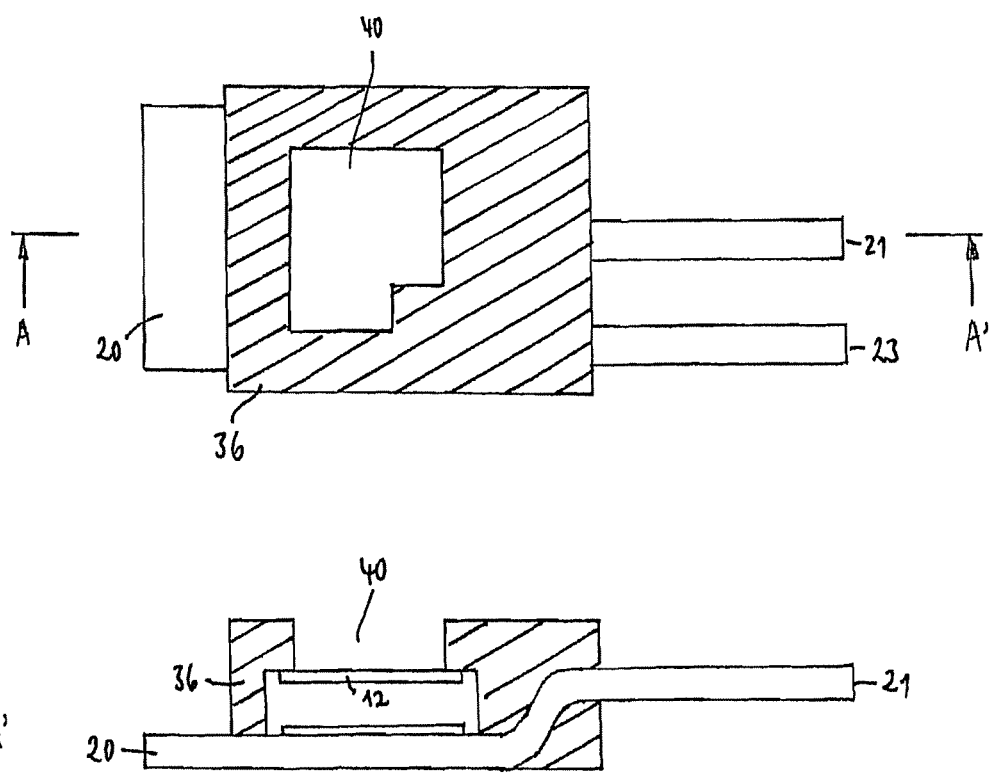

A through-hole 40 is created in the mold material 36 as illustrated in FIG. 5E. The through-hole 40 exposes at least portions of the electrode 12 of the power semiconductor chip 10. The through-hole 40 allows electrical connections to be made to the electrode 12.

If the mold material 36 contains photo-active components, the mold material 36 may be photo-lithographically structured. As an alternative the mold material 36 may, for example, be structured by a stamping process, laser ablation, etching, mechanical drilling or any other suitable process known to a person skilled in the art.

Figure 5F:
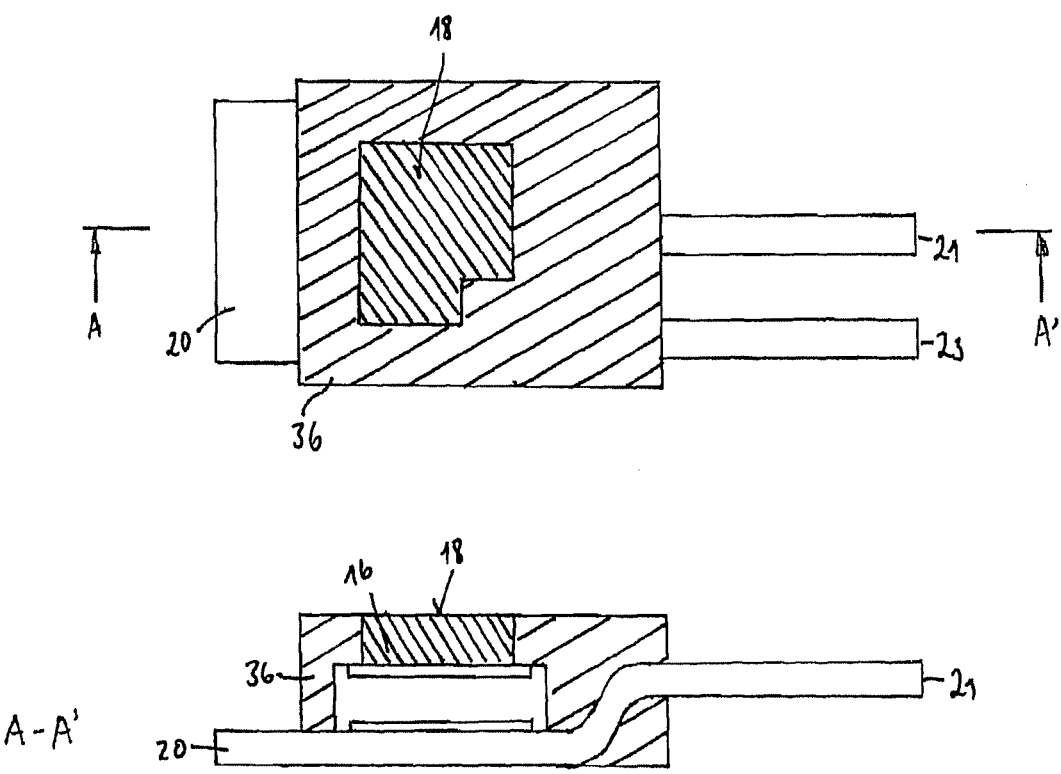
Figure 5G:
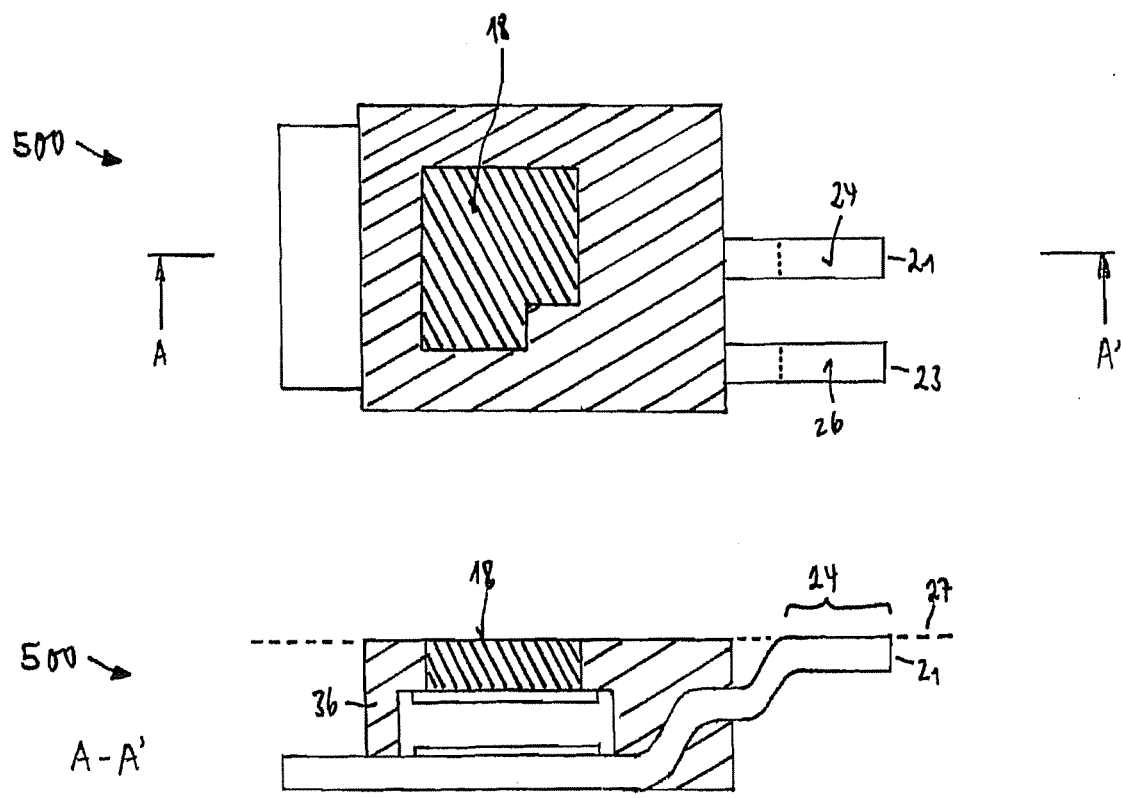

The through-hole 40 produced in the mold material 36 may be filled with a metal or metal alloy in order to form the metallic layer 16 functioning as a through-connection in the mold material 36 as illustrated in FIG. 5F. Copper, iron, nickel, aluminum or other metals or metal alloys may be used as the material. The metal may be deposited in the through-hole 40 by using a galvanic deposition method or any other appropriate deposition method.

The fabrication process illustrated in FIG. 5G is substantially the same as the fabrication process illustrated in FIG. 4F.

Figure 6:
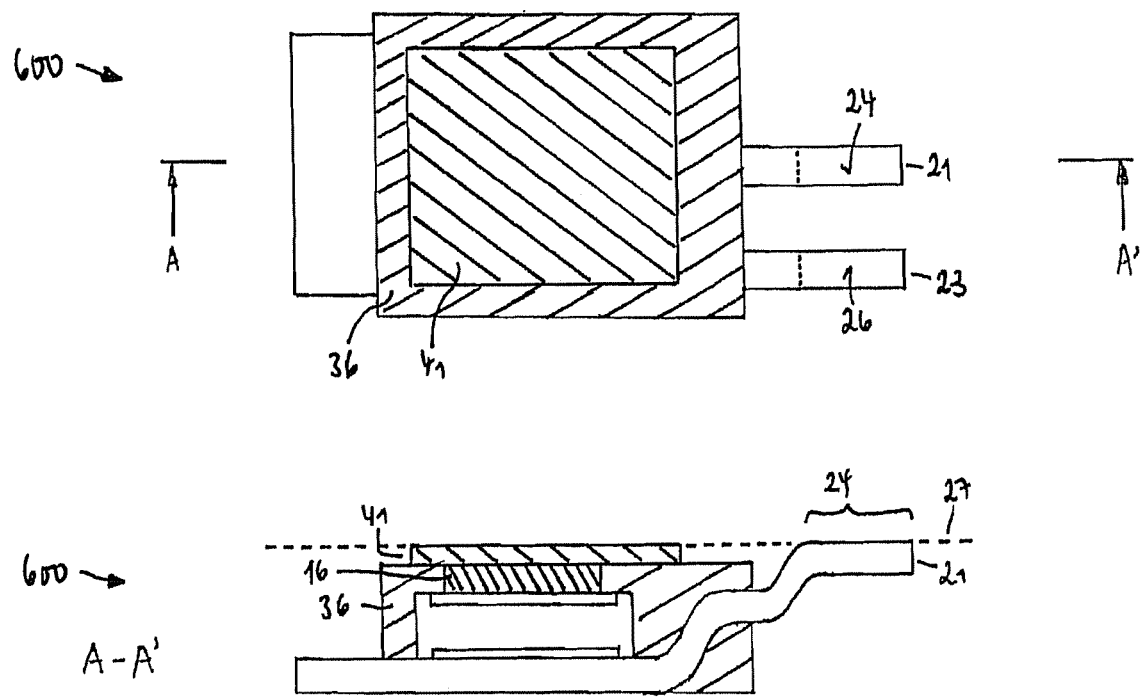
FIG. 6 schematically illustrates a top plan view and a cross-sectional view of one embodiment of a device including a power semiconductor chip and two electrochemically deposited metallic layers.

In FIG. 6 a device 600 is schematically illustrated that is almost identical to the device 500, but includes a metallic layer 41 on top of the metallic layer 16 and the mold material 36. In the device 600 the mold material 36 may act as a platform for the deposition of the metallic layer 41. The metallic layer 41 may have a thickness in the range from 10 to 500 µm or may even be thicker. The metallic layer 41 may be structured as illustrated in FIG. 6 so that only a part of the top surface of the mold material 36 is covered by the metallic layer 41. The metallic layer 41 may have any size and structure so that any desired footprint geometry may be created by the metallic layer 41.

The metallic layer 41 may be fabricated by using a galvanic deposition method. For that, a seed layer is first deposited onto the top surfaces of the mold material 36 and the metallic layer 16. The seed layer usually has a thickness of some hundred nanometers. Materials such as palladium or titanium may be used for the seed layer.

The thickness of the seed layer may be increased by depositing a further layer of an electrically conducting material onto the seed layer. For example, a layer of copper may be electroless deposited onto the seed layer. This copper layer may have a thickness of less than 1 µm. Afterwards another layer of copper may be galvanically deposited, which may have a thickness of more than 10 µm. The electroless copper deposition may also be omitted. The metallic layer 41 may be structured after the completed deposition process of all its layers or after the deposition of the seed layer.

In one embodiment, the seed layer may be deposited by a vacuum deposition process, such as sputtering. For example, first a layer of titanium having a thickness of, for example, about 50 nm and afterwards a layer of copper having a thickness of, for example, about 200 nm are sputtered. The copper layer may then be used as a seed layer to galvanically deposit a further copper layer having a thickness of more than 10 µm.

As further alternatives, other deposition methods, such as physical vapor deposition, chemical vapor deposition, spin-on processes, spray deposition or ink jet printing may also be employed. Furthermore, the metallic layer 41 may be a metal film, for example a copper film, which is laminated onto the top surfaces of the mold material 36 as well as the metallic layer 16. Vacuum, heat and pressure may be applied for a time suitable to attach the metallic layer 41 to the underlying materials.

Figure 7:
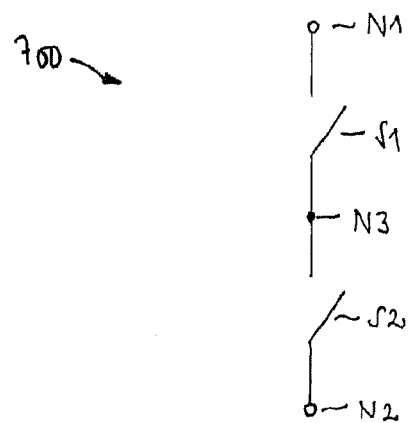
FIG. 7 illustrates a basic circuit of a half-bridge.

The devices 100, 200, 300, 400, 500 and 600 may be used as components of a half-bridge circuit. A basic circuit of a half-bridge 700 arranged between two nodes N1 and N2 is illustrated in FIG. 7. The half-bridge 700 consists of two switches S1 and S2 connected in series. Semiconductor chips, for example the power semiconductor chips 10 of the devices 100 to 600, may be implemented as the switches S1 and S2. Constant electrical potentials may be applied to the nodes N1 and N2. For example, a high electrical potential, such as 10, 50, 100, 200, 500 or 1000 V or any other potential, may be applied to the node N1 and a low electrical potential, for example 0 V, may be applied to the node N2. In this case the switch S1 is called high side switch and the switch S2 is called low side switch. The switches S1 and S2 may be switched at frequencies in the range from 1 kHz to 100 MHz, but the switching frequencies may also be outside this range. This means that a varying electrical potential is applied to a node N3 arranged between the switches S1 and S2 during operation of the half-bridge 700. The potential of the node N3 varies in the range between the low and the high electrical potential.

The half-bridge 700 may, for example, be implemented in electronic circuits for converting DC voltages, for example, DC-DC converters. DC-DC converters may be used to convert a DC input voltage provided by a battery or a rechargeable battery into a DC output voltage matched to the demand of electronic circuits connected downstream. DC-DC converters may be embodied as step-down converters, in which the output voltage is less than the input voltage, or as step-up converters, in which the output voltage is greater than the input voltage. Frequencies of several MHz or higher may be applied to DC-DC converters. Furthermore, currents of up to 50 A or even higher may flow through the DC-DC converters.

Figure 8:
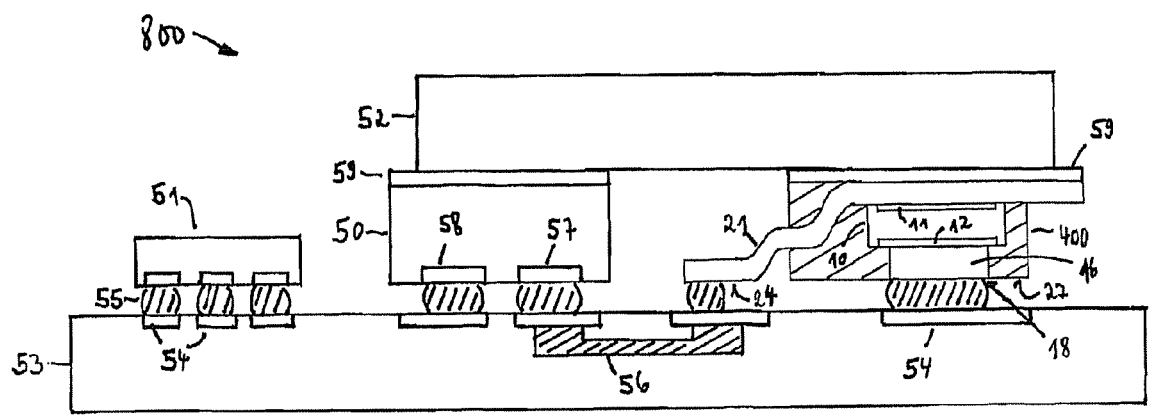
FIG. 8 schematically illustrates a cross-sectional view of one embodiment of a system including a circuit board, three devices mounted on the circuit board and a cooling element.

FIG. 8 schematically illustrates a cross-sectional view of a system 800. The system 800 includes the device 400, a device 50, a control device 51, a cooling element 52 and a circuit board 53. Instead of the device 400, one of the devices 100, 200, 300, 500 and 600 may be integrated in the system 800. The device 400 is mounted on the circuit board 53 with its mounting surface 27 facing the circuit board 53. Furthermore, the devices 50 and 51 are mounted on the circuit board 53. Further devices, which are not illustrated in FIG. 8, may be additionally mounted on the circuit board 53.

The circuit board 53 may be a PCB and may include contact pads 54 on its upper surface to which the devices 50, 51 and 400 are attached. For example, the external contact surfaces 18, 24 and 26 of the device 400 may have been soldered to the contact pads 54 of the circuit board 53 by using solder deposits 55.

The devices 50 and 400 are coupled to each other in a half-bridge circuit. In one embodiment, the device 50 may function as the high side switch S1 of the half-bridge circuit 700 illustrated in FIG. 7 and the device 400 may function as the low side switch S2. The power semiconductor chip 10 of the device 400 may be an n-type power MOSFET in one embodiment. The device 50 may include a power transistor or a power diode. Exemplarily, one conductor track 56 of the circuit board 53 is illustrated in FIG. 8. The conductor track 56 electrically couples the lead 21 and thus the drain electrode 11 of the power MOSFET 10 to an external contact pad 57 of the device 50. When compared to the half-bridge circuit 700 illustrated in FIG. 7, an external contact pad 58 of the device 50 is the node N1, the source electrode 12 of the power MOSFET 10 is the node N2, and the conductor track 56 is the node N3. During operation of the system 800, a constant high electrical potential is applied to the external contact pad 58 of the device 50, and a constant low electrical potential is applied to the metallic plate (or metallic clip) 16 and thus the source electrode 12 of the device 400.

The cooling element 52 (or heat sink) may be attached on top of the devices 50 and 400. The cooling element 52 may be electrically insulated from the top surfaces of the devices 50 and 400 by an electrically insulating layer 59. The electrically insulating layer 59 may, for example, be made of a foil, a paste or any other electrically insulating material having a sufficient thermal conductivity. The cooling element 52 dissipates the heat generated by semiconductor chips included in the devices 50 and 400 during operation.

The control device 51 may be configured to control the devices 50 and 400. In one embodiment, the control device 51 may drive the electrical potentials of the control terminals of the devices 50 and/or 400 (not illustrated in FIG. 8), thus controlling the switching of the switches S1 and/or S2.

Since a constant potential is applied to the electrode 12 of the power semiconductor chip 10 of the device 400 during operation, the external contact surface 18 of the device 400 may be attached to a large contact pad 54 of the circuit board 53. Due to the applied constant potential electrical charge does not need to be transferred to and from this contact pad 54 when switching the power semiconductor chip 10 of the device 400.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:
 a power semiconductor chip comprising a first electrode on a first surface, and a second electrode and a third electrode on a second surface opposite to the first surface;
 a leadframe comprising a carrier and a first lead and a second lead, the power semiconductor chip placed on the carrier with the first surface of the power semiconductor chip facing the carrier, wherein the first lead is electrically coupled to the first electrode of the power semiconductor chip, and wherein the second lead is electrically separate from the first lead and is laterally offset from the power semiconductor chip such that no portion of the second lead is disposed above the second surface of the power semiconductor chip; and
 a metallic layer separate from the leadframe and comprising a first surface and a second surface opposite to the first surface, the metallic layer disposed on the second surface of the power semiconductor chip with the first surface of the metallic layer facing the power semiconductor chip, wherein the metallic layer extends between and directly electrically connects the second electrode of the power semiconductor chip to the second lead,
 wherein the second surface of the metallic layer, a surface of the first lead, and a surface of the second lead lie within a common mounting plane.

2. The device of claim 1, comprising wherein the first lead is electrically coupled to the carrier.

3. The device of claim 1, comprising wherein the first lead is integral with the carrier.

4. The device of claim 1, further comprising:
 a third lead, a surface of which lies within the common mounting plane.

5. The device of claim 4, comprising wherein the third lead is electrically coupled to the third electrode.

6. The device of claim 4, comprising wherein a bond wire is attached to the third lead and the third electrode.

7. The device of claim 1, comprising wherein a surface of the carrier over which the power semiconductor chip is placed is larger than the first surface of the power semiconductor chip.

8. The device of claim 1, comprising wherein the second surface of the metallic layer and the surface of the first lead lying within the common mounting plane are external contact surfaces.

9. The device of claim 1, comprising wherein the metallic layer is one of a metallic clip, a metallic plate and an electrochemically deposited metallic layer.

10. The device of claim 1, further comprising:
 a mold material covering the power semiconductor chip and leaving the second surface of the metallic layer exposed.

11. The device of claim 1, comprising wherein the power semiconductor chip is a power semiconductor transistor.

12. The device of claim 1, comprising wherein the first lead is bent in an S-shaped manner.

13. The device of claim 12, comprising wherein the bending of the first lead is exposed from a mold material.

14. The device of claim 1, wherein the second lead is separated and spaced apart from the carrier.

15. The device of claim 1, wherein the first lead includes two S-shaped bends which step the first lead in a direction toward the power semiconductor chip such that the surface of the first lead lies within the common mounting plane, wherein at least one of the S-shaped bends is outside of a mold material encapsulating the power semiconductor chip.

16. A half-bridge circuit, comprising:
a first device comprising
a first power semiconductor chip comprising a first electrode on a first surface and a second electrode and a third electrode on a second surface opposite to the first surface;
a leadframe comprising a carrier and a first lead and a second lead, the first power semiconductor chip placed over the carrier with the first surface of the first power semiconductor chip facing the carrier, wherein the first lead is electrically coupled to the first electrode of the first power semiconductor chip, and wherein the second lead is electrically separate from the first lead and is laterally offset from the power semiconductor chip such that no portion of the second lead is disposed above the second surface of the power semiconductor chip;
a metallic layer separate from the leadframe and comprising a first surface and a second surface opposite to the first surface, the metallic layer disposed on the second surface of the first power semiconductor chip with the first surface of the metallic layer facing the first power semiconductor chip, wherein the metallic layer extends between and directly electrically connects the second electrode of the power semiconductor chip to the second lead,
wherein the second surface of the metallic layer, a surface of the first lead, and a surface of the second lead lie within a common mounting plane; and
a circuit board, the first device mounted on the circuit board with the common mounting plane facing the circuit board.

17. The half-bridge circuit of claim 16, further comprising:
a second device mounted on the circuit board, the second device comprising a second power semiconductor chip.

18. The half-bridge circuit of claim 16, comprising wherein the first device is a low side switch.

* * * * *